United States Patent
Chen

(10) Patent No.: US 7,192,872 B2
(45) Date of Patent: Mar. 20, 2007

(54) METHOD OF MANUFACTURING SEMICONDUCTOR DEVICE HAVING COMPOSITE BUFFER LAYER

(75) Inventor: Xingbi Chen, Shanghai (CN)

(73) Assignee: Tongji University (CN)

( * ) Notice: Subject to any disclaimer, the term of this patent is extended or adjusted under 35 U.S.C. 154(b) by 218 days.

(21) Appl. No.: 10/490,817

(22) PCT Filed: Sep. 24, 2002

(86) PCT No.: PCT/CN02/00675

§ 371 (c)(1),
(2), (4) Date: Sep. 20, 2004

(87) PCT Pub. No.: WO03/028076

PCT Pub. Date: Apr. 3, 2003

(65) Prior Publication Data

US 2005/0029222 A1   Feb. 10, 2005

(30) Foreign Application Priority Data

Sep. 27, 2001 (CN) ................................ 01 1 41993

(51) Int. Cl.
*H01L 21/311* (2006.01)
(52) U.S. Cl. ...................................... 438/700; 257/401
(58) Field of Classification Search ................ 438/700, 438/702, 703, 706, 719; 257/401, 487
See application file for complete search history.

(56) References Cited

U.S. PATENT DOCUMENTS 5,216,275 A  *  6/1993  Chen ......................... 257/493
6,046,083 A  *  4/2000  Lin et al. ..................... 438/255
6,649,459 B2 * 11/2003  Deboy et al. ............... 438/173
6,677,641 B2 *  1/2004  Kocon ......................... 257/329
2003/0071320 A1*  4/2003  Kocon ......................... 257/487
2004/0063269 A1*  4/2004  Kocon ......................... 438/206

FOREIGN PATENT DOCUMENTS

| JP | 6425586 | 1/1989 |
| JP | 4034920 | 2/1992 |
| JP | 4146679 | 5/1992 |
| JP | 6077522 | 3/1994 |

* cited by examiner

*Primary Examiner*—Kin-Chan Chen
(74) *Attorney, Agent, or Firm*—McDonnell Boehnen Hulbert & Berghoff LLP

(57) ABSTRACT

The present invention relates to a method of manufacturing semiconductor device with composite buffer layers. The method includes etching grooves in n type and p type semiconductor wafers respectively. The areas of grooves in n type wafer just correspond to the areas without grooves in p type wafer, and vice versa. The grooves in both n type and p type wafers have the same depth. Two wafers are directly bonded together so that the grooves in one wafer are filled with the grooves in the other wafer. Then, chemical bonding is implemented. The bonding may also be made through thin dielectric layer (e.g. $SiO_2$). If necessary, grinding, polishing or chemical mechanical polishing processes are carried out to remove the redundant material. Thereby, it is easy to manufacture the semiconductor device with composite buffer layer as voltage sustaining layer.

15 Claims, 12 Drawing Sheets

METHOD OF MANUFACTURING SEMICONDUCTOR DEVICE HAVING COMPOSITE BUFFER LAYER

FIELD OF THE INVENTION

The present invention relates to a method for manufacturing the semiconductor power devices, particularly to a method for manufacturing the semiconductor power devices with the composite buffer layers.

BACKGROUND OF THE INVENTION

It is well known that in the common power devices, the reverse voltage applied across the n+ region(s) and the $p^+$ region(s) is sustained by a lightly doped semiconductor layer, called hereafter a Voltage Sustaining Layer. For high voltage power devices, the on-resistance $R_{on}$ (or the on-voltage) is also dominantly determined by the voltage sustaining layer. The lower the doping concentration is and/or the larger the thickness is, the higher the breakdown voltage is, but the larger the on-resistance (or the on-voltage) also is. For many power devices, one of the most important problems is to get both high breakdown voltage and low on-resistance. The relation between them has become an obstacle for manufacturing high performance power devices. Moreover, said $R_{on}$ refers to the conduction area of the voltage sustaining layer, but practically there always exist some areas which do not contribute much to the conduction. For example, the area under the source body in a vertical MOSFET (metal oxide semiconductor field effect transistor) and the area under the base contact of the bipolar transistors are both the areas which do not contribute much to the conduction.

The inventor's CN patent ZL91101845.X and U.S. Pat. No. 5,216,275 have solved the problems above, by using a composite buffer layer (CB-layer) between the $p^+$ region(s) and the n+ region(s) to sustain voltage. The CB-layer contains two kinds of regions with opposite types of conduction. The two kinds of regions are alternately arranged, viewed from any cross-section parallel to the interface between the CB-layer and the n+ layer (or the $p^+$ layer). However, the hitherto-used voltage sustaining layers are the semiconductors of a single conductivity type. The above inventions also disclose a MOS tube with such voltage sustaining layer, of which the on-resistance $R_{on}$ in unit area is proportional to 1.3rd power of the breakdown voltage $V_B$. This represents a breakthrough for the relation of the common voltage sustaining layers; meanwhile, the other electronic performance of the MOS tube also acts well.

In the past few years, great changes have taken place in the semiconductor power devices industry. The MOS tubes having the super-junction device structure (that is CB-layer structure) can provide high voltages and large currents.

FIG. 1(a) to FIG. 1(b) show a method for manufacturing a super-junction power device 1. The process begins with a wafer of substrate 2 on which a first epitaxial layer 3 grows. The substrate 2 in these figures is a heavily doped $n^+$ layer, while the first epitaxial layer 3 is a lightly doped n layer, in which the ions are implanted to form a layer of the p type region 4. Generally speaking, one epitaxial layer is required to sustain every 50 to 100 voltage. Therefore, for a 600V transistor, it is required to form n type epitaxial layers 5,7,9,11 and 13 shown in FIG. 1(a); after each epitaxy process, it is required to form p type ion-implant layers 6,8,10,12 and 14 shown in FIG. 1(a).

After the diffusion of the p type ion-implant layers 4,6,8,10,12 and 14, p region 16 is formed, as shown in FIG. 1(b). The region without influence of ion-implantation is n region 15. Thus the alternately arranged p region and n region are created. Thereafter, a device layer or so-called device feature layer 17 is manufactured. The device feature layer 17 contains the ion-implanted $n^+$ source regions 18, the oxide layers 19 and the metal gate or polycrystalline silicon gate 20 thereon. A $p^+$ region 21 is provided between the two $n^+$ source regions 18. A deep junction $p^+$ region 22 is under the $p^+$ region 21. The deep $p^+$ region 22 connects to the $p^+$ region 21.

Obviously, the above methods are very costly. Moreover, as some defects are introduced in each epitaxy process, the more time the epitaxy process is developed, the lower the quality of semiconductor is and the lower the quality of device is. Besides, the CN patent ZL91101845.X and U.S. Pat. No. 5,216,275 describes another important case that a thin dielectric layer is between the alternately arranged n region and p region. The above method apparently can't be used in such condition.

SUMMARY OF THE INVENTION

The purpose of the present invention is to provide a simple method for manufacturing CB-layer, which doesn't require many times of epitaxy, ion-implantation or etching so that the cost can be reduced.

To achieve the above purpose, the present invention provides a method for manufacturing a semiconductor device with composite buffer layer, which comprises the steps of:

covering a first semiconductor wafer of a first conductivity type with a first mask of a first pattern, wherein the first mask of the first pattern makes some portions of the surface of the semiconductor wafer be covered by the first mask while the other portions are not covered;

etching the portions of the semiconductor wafer uncovered by the mask, so as to form first mosaic grooves of first depth which have bottoms and sidewalls;

forming a thin dielectric layer on the sidewall of the groove, and/or a thin dielectric layer on the bottom of the groove, and/or a thin dielectric layer on the surface of the first semiconductor wafer outside the groove, on the first semiconductor wafer having the first mosaic grooves;

covering a second semiconductor wafer of a second conductivity type with a second mask of a second pattern, wherein the second mask of the second pattern makes the portions of the second semiconductor wafer covered by the second mask be identical with the pattern formed by the bottoms of the grooves of the first semiconductor wafer;

etching the portions of the second semiconductor wafer uncovered by the second mask, so as to form second mosaic grooves which have bottoms, sidewalls, and depths approaching the first depth;

forming the thin dielectric layer on the sidewall of the groove, and/or a thin dielectric layer on the bottom of the groove, and/or a thin dielectric layer on the surface of the first semiconductor wafer outside the groove, on the second semiconductor wafer having the second mosaic grooves;

bonding the surface outside the grooves of the second semiconductor wafer with the bottoms of the grooves of the first semiconductor wafer, bonding the bottoms of the grooves of the second semiconductor wafer with the surface outside the grooves of the first semiconductor wafer, and bonding the sidewalls of the grooves of the first semiconductor wafer with the sidewalls of the grooves of the second semiconductor, so that the two wafers are bonded as one semiconductor wafer; and forming a composite buffer layer within the first depth in the bonded semiconductor wafer.

According to the above method for manufacturing a semiconductor device with composite buffer layer, the dielectric layer is made of silicon dioxide.

According to the above method for manufacturing a semiconductor device with composite buffer layer, the thin dielectric layer is formed on the sidewalls, the bottoms and the surface outside the grooves on the first semiconductor wafer with the first mosaic grooves and the second semiconductor wafer with the second mosaic grooves.

According to the above method for manufacturing a semiconductor device with composite buffer layer, the thin dielectric layer is formed on the sidewalls of the grooves on the first semiconductor wafer with the first mosaic grooves.

According to the above method for manufacturing a semiconductor device with composite buffer layer, the thin dielectric is formed on the sidewalls and the bottoms of the grooves on the first semiconductor wafer with the first mosaic grooves.

According to the above method for manufacturing a semiconductor device with composite buffer layer, the thin dielectric is formed on the sidewalls of the grooves on the second semiconductor wafer with the second mosaic grooves.

According to the above method for manufacturing a semiconductor device with composite buffer layer, the thin dielectric is formed on the sidewalls and the bottoms of the grooves on the second semiconductor wafer with the second mosaic grooves.

The present invention provides another method for manufacturing a semiconductor device with composite buffer layer, which comprises the steps of:

covering a first semiconductor wafer of a first conductivity type with a first mask of a first pattern, wherein the first mask of the first pattern makes some portions of the surface of the semiconductor wafer be covered by the first mask while the other portions are not covered;

etching the portions of the semiconductor wafer uncovered by the mask, so as to form first mosaic grooves of first depth, which have bottoms and sidewalls;

covering a second semiconductor wafer of a second conductivity type with a second mask of a second pattern, wherein the second mask of the second pattern makes the portions of the second semiconductor wafer covered by the second mask be identical with the pattern formed by the bottoms of the grooves of the first semiconductor wafer;

etching the portions of the second semiconductor wafer uncovered by the second mask, so as to form second mosaic grooves which have bottoms, sidewalls, and depths approaching the first depth;

bonding the surface outside the grooves of the second semiconductor wafer with the bottoms of the grooves of the first semiconductor wafer, bonding the bottoms of the grooves of the second semiconductor wafer with the surface outside the grooves of the first semiconductor wafer, and bonding the sidewalls of the grooves of the first semiconductor wafer with the sidewalls of the grooves of the second semiconductor, so that the two wafers are bonded as one semiconductor wafer; and forming the composite buffer layer within the first depth in the bonded semiconductor wafer.

According to the above method for manufacturing a semiconductor device with composite buffer layer, the step of forming the first mosaic groove adopts an anisotropic etching method.

According to the above method for manufacturing a semiconductor device with composite buffer layer, the step of forming the second mosaic groove adopts an anisotropic etching method.

According to the above method for manufacturing a semiconductor device with composite buffer layer, the materials of both the first semiconductor wafer and second semiconductor wafer are silicon.

According to the above method for manufacturing a semiconductor device with composite buffer layer, the first semiconductor wafer of the first conductivity type includes a first epitaxial layer of the first conductivity type and a heavily doped substrate of the first conductivity type; the first mosaic groove is formed in the first epitaxial layer, and the thickness of the first epitaxial layer approaches the first depth of the groove.

According to the above method for manufacturing a semiconductor device with composite buffer layer, the second semiconductor wafer of the second conductivity type includes a second epitaxial layer of the second conductivity type and a heavily doped substrate of the second conductivity type; the second mosaic groove is formed in the second epitaxial layer, and the thickness of the second epitaxial layer approaches the first depth of the groove.

The present invention also provides a semiconductor device with composite buffer layer, wherein a first semiconductor wafer of a first conductivity type is covered with a first mask of a first pattern which makes some portions of the surface of the semiconductor wafer be covered by the first mask while the other portions are not covered;

first mosaic grooves of first depth, which have bottoms and sidewalls are at the etched and removed portions of the semiconductor wafer uncovered by the mask;

a thin dielectric layer is on the sidewall of the groove, and/or a thin dielectric layer is on the bottom of the groove, and/or a thin dielectric layer is on the surface of the first semiconductor wafer outside the groove, on the first semiconductor wafer having the first mosaic grooves;

a second semiconductor wafer of a second conductivity type is covered with a second mask of a second pattern, wherein the second mask of the second pattern makes the portions of the second semiconductor wafer covered by the second mask be identical with the pattern formed by the bottoms of the grooves of the first semiconductor wafer;

second mosaic grooves which have bottoms, sidewalls, and depths approaching the first depth are at the etched portions of the second semiconductor wafer uncovered by the second mask;

a thin dielectric layer is on the sidewall of the groove, and/or a thin dielectric layer is on the bottom of the groove, and/or a thin dielectric layer is on the surface of the first semiconductor wafer outside the groove, on the second semiconductor wafer having the second mosaic grooves;

the surface outside the grooves of the second semiconductor wafer is bonded with the bottoms of the grooves of the first semiconductor wafer, the bottoms of the grooves of the second semiconductor wafer are bonded with the surface outside the grooves of the first semiconductor wafer, and the sidewalls of the grooves of the first semiconductor wafer are bonded with the sidewalls of the grooves of the second semiconductor, so that the two wafers are bonded as one semiconductor wafer; and the composite buffer layer is within the first depth in the bonded semiconductor wafer.

The present invention also provides a semiconductor device with composite buffer layer, wherein a first semiconductor wafer of a first conductivity type is covered with a first mask of a first pattern which makes some portions of the surface of the semiconductor wafer be covered by the first mask while the other portions are not covered;

first mosaic grooves which have bottoms and sidewalls with first depth are at the etched portions of the semiconductor wafer uncovered by the mask;

a second semiconductor of a second conductivity type is covered with a second mask of a second pattern, wherein the second mask of the second pattern makes the portions of the second semiconductor wafer covered by the second mask be identical with the pattern formed by the bottoms of the grooves of the first semiconductor wafer;

second mosaic grooves which have bottoms, sidewalls, and depths approaching the first depth are at the etched portions of the second semiconductor wafer uncovered by the second mask;

the surface outside the grooves of the second semiconductor wafer is bonded with the bottoms of the grooves of the first semiconductor wafer, the bottoms of the grooves of the second semiconductor wafer are bonded with the surface outside the grooves of the first semiconductor wafer, and the sidewalls of the grooves of the first semiconductor wafer are bonded with the sidewalls of the grooves of the second semiconductor, so that the two wafers are bonded as one semiconductor wafer; and the composite buffer layer is within the first depth in the bonded semiconductor wafer.

As described above, the present invention provides a simple method for manufacturing CB-layer, which doesn't require many times of epitaxy, ion-implantation or etching so that the cost can be reduced.

DESCRIPTION OF SPECIFIC EMBODIMENTS

Figure 1A:
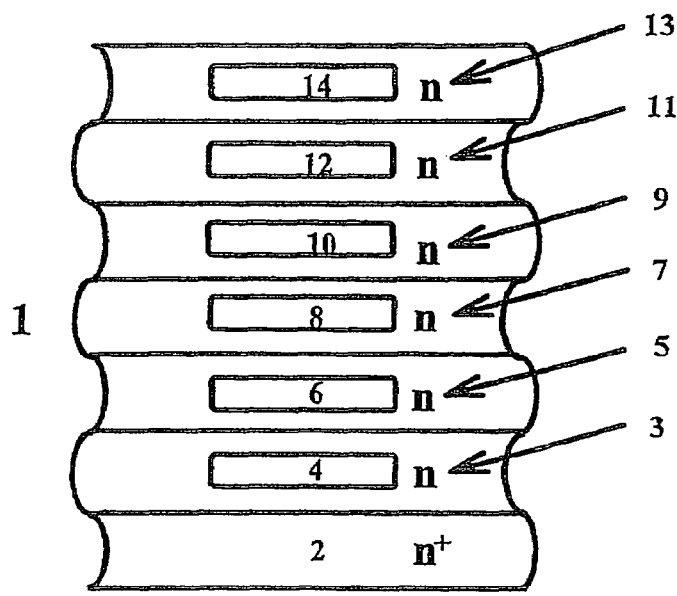
FIG. 1(a) and FIG. 1(b) illustrate schematic views of manufacturing CBMOSFET( or super-junction devices) in the prior art.
Figure 1B:
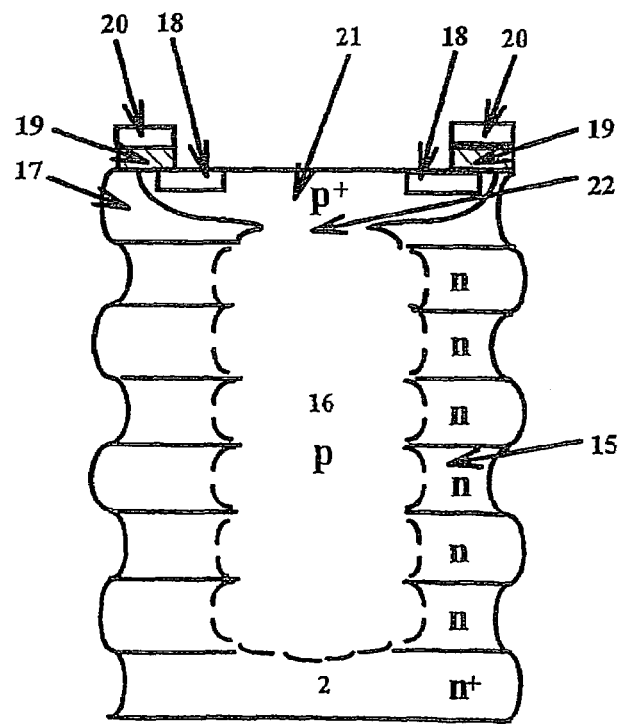

The present invention provides a method for manufacturing CBMOSFET or Super-Junction devices.

Recently a novel MOSFET called COOLMOST was fabricated and is considered a milestone of the power devices because of its excellent electrical performance, especially because of the breakthrough of the relationship between the on-resistance and the breakdown voltage of the traditional power devices. Actually, the voltage sustaining layer used in COOLMOST is based on the CB structure of the hexangular pattern described in CN patent ZL91101845.X and U.S. Pat. No. 5,216,275. Such devices are also called CBMOSFET or Super-Junction Devices.

The device made according to the present invention contains a contact layer of a first conductivity type material, which can be the $n^+$ type semiconductor or the $p^+$ semiconductor. Here, the $n^+$ type semiconductor is used for explanation in the present invention. Many multi-angular cells are formed on the contact layer. Each cell has a device feature layer with device feature area. Such feature layer functions as a second conductivity type material, such as the $p^+$ type semiconductor or the $n^+$ type semiconductor. Here, it is used for explanation in the present invention. A composite buffer layer, named CB layer, lies between the device feature layer and the contact layer. The CB layer contains a first semiconductor region consisting of the first conductivity type material which can be the n type semiconductor or the p type semiconductor, but in the present invention the n type conductivity material is used for illustration. The CB layer contains a second semiconductor region consisting of a second conductivity type material which can be the n type semiconductor or the p type semiconductor, but in the present invention the p type conductivity material is used for illustration. The first and second semiconductor regions of CB layer are alternately arranged. A thin dielectric layer may also lie between the first and second semiconductor regions of the CB layer to isolate the first semiconductor region from the second semiconductor region. A thin dielectric layer may also lie between the second semiconductor region and the contact layer of the CB layer to isolate the second semiconductor region from the contact layer.

The present invention provides a method for manufacturing such semiconductor devices, which comprises the following steps:

covering a first semiconductor wafer having a first epitaxial layer with a mask, and then removing some portion of the mask by photo-etching process or other methods to form a first mask with a certain pattern which is called a first mask of a first pattern, wherein the first mask of the first pattern makes some portions of the surface of the semiconductor wafer be covered by the first mask while the other portions are not covered;

etching and removing the portions of the first epitaxial layer of the semiconductor wafer uncovered by the mask, so as to form first mosaic pattern which has grooves; the grooves have bottoms and sidewalls, wherein the depth of the grooves is a first depth; after the etching step, forming a thin dielectric layer on the sidewall of the groove; maybe forming a thin dielectric layer on the bottom of the groove; maybe forming a thin dielectric layer on the portion of the first epitaxial layer of the first semiconductor wafer without grooves (i.e. the surface of the semiconductor wafer without the grooves); alternatively, maybe forming no dielectric layer; forming a second pattern on the bottom of the grooves of the first semiconductor wafer;

covering a second semiconductor wafer of a second conductivity type with a mask, and then removing some portion of the mask by photo-etching process or other methods to form a second mask with a certain pattern which is called a second mask of a second pattern, wherein the second mask of the second pattern makes the portions of the second semiconductor wafer covered by the second mask be identical with the pattern formed by the bottoms of the grooves of the first semiconductor wafer;

etching and removing the portions of the second semiconductor wafer uncovered by the second mask, so as to form second mosaic grooves which have bottoms, sidewalls, and depths approaching the first depth;

forming a thin dielectric layer on the sidewall of the groove on the second semiconductor wafer having the second mosaic grooves; maybe forming a thin dielectric layer on the bottom of the groove; maybe forming a thin dielectric layer on the surface of the second semiconductor wafer outside the groove; alternatively, maybe forming no dielectric layer;

bonding the surface outside the grooves of the second semiconductor wafer with the bottoms of the grooves of the first semiconductor wafer, bonding the bottoms of the grooves of the second semiconductor wafer with the surface outside the grooves of the first semiconductor wafer, and bonding the sidewalls of the grooves of the first semiconductor wafer with the sidewalls of the grooves of the second semiconductor, so that the two wafers are bonded as one semiconductor wafer; and forming the composite buffer layer within the first depth in the bonded semiconductor wafer.

Figure 2A:
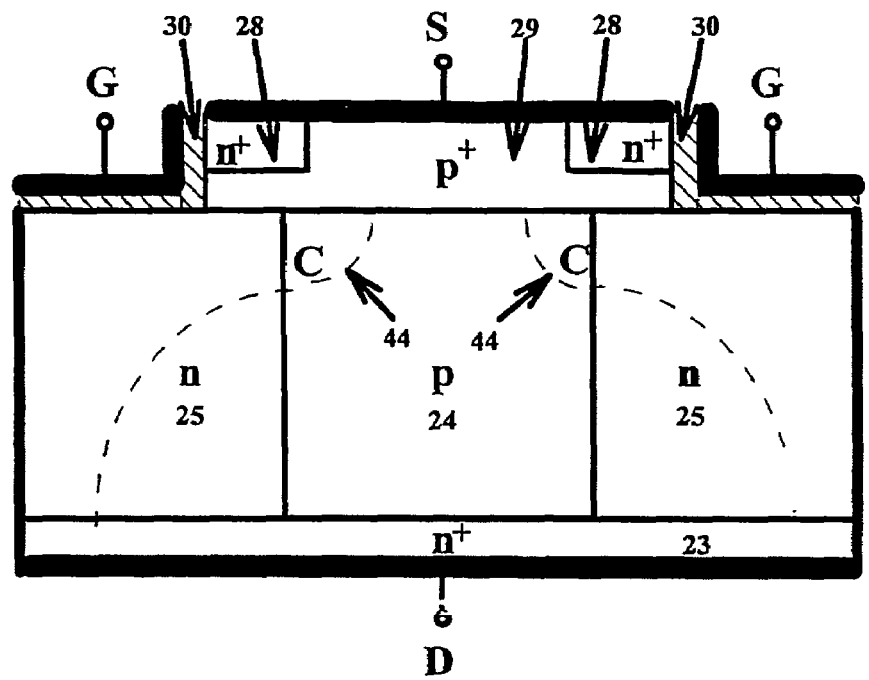
FIG. 2(a) and FIG. 2(b) illustrate schematic views of two typical RMOST with and without dielectric isolation according to the present invention.
Figure 2B:
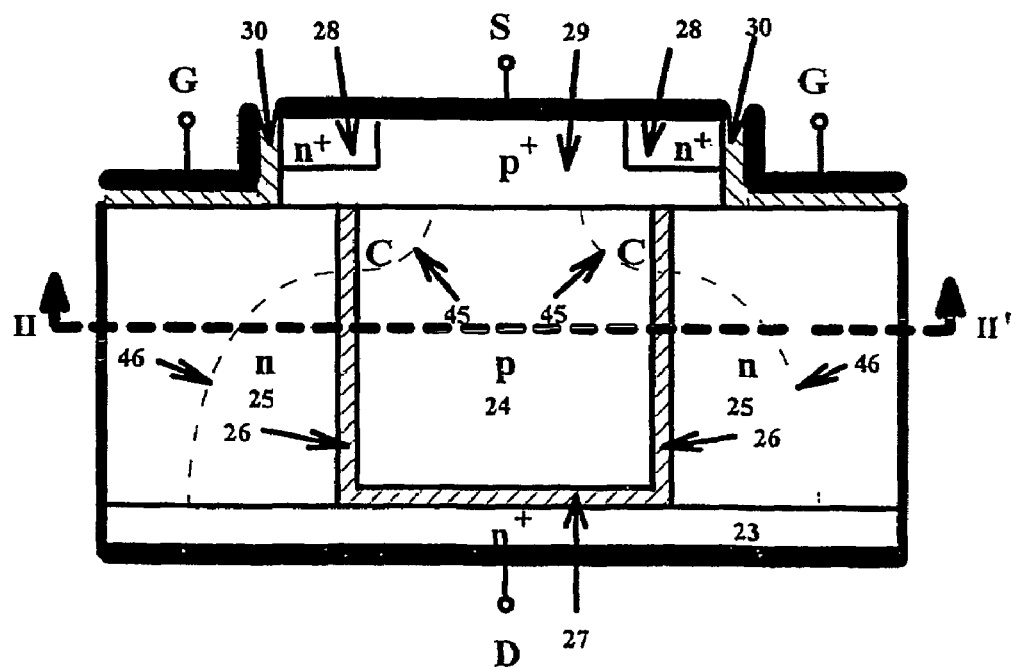

It is proposed in CN patent ZL91101845.X and U.S. Pat. No. 5,216,275 that there are many type of CB structure. FIG. 2(a) and FIG. 2(b) show two types of RMOST with CB structure. One type of them has no dielectric layers between the p type region 24 from the n type region 25 as shown in FIG. 2(a). The other type of them has a thin dielectric layer 26 to isolate the p type region 24 from the n type region 25, and also has a thin dielectric layer 27 to isolate the p type region 24 from the n+ type substrate 23 as shown in FIG. 2(b). In these Figures, "28" refers to a n+ source region, "29" refers to a source substrate region and "30" refers to a gate oxide layer.

FIG. 3(a) to FIG. 3(d) provide four pattern layouts of the n region and the p region on the cross section along II–II' of FIG. 2(b). Among them, the portion left to the dashed line represents the active region, while the arrow 48 represents the direction from the active region boundary to the termination. "24" represents the p region in the CB structure, "25" represents the n region in the CB structure, and "26" represents the thin dielectric layer between the p region and the n region in the CB structure.

Figure 3A:
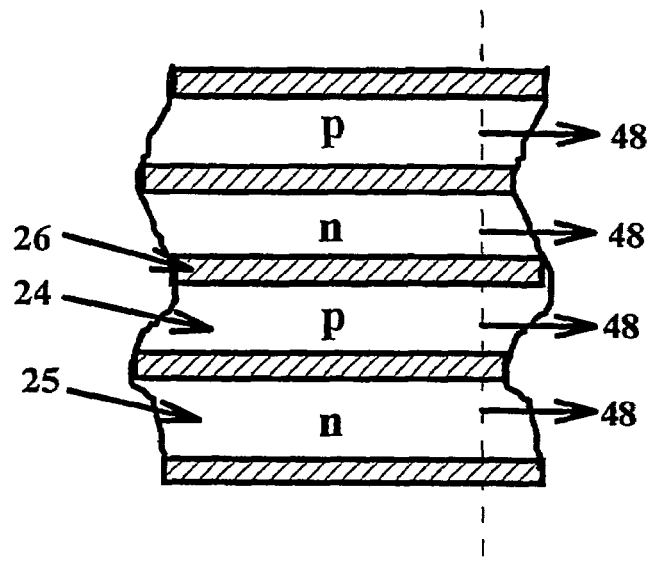
FIG. 3(a) to FIG. 3(d) show the pattern layouts on the section containing section line II–II' of FIG. 2(b)
Figure 3B:
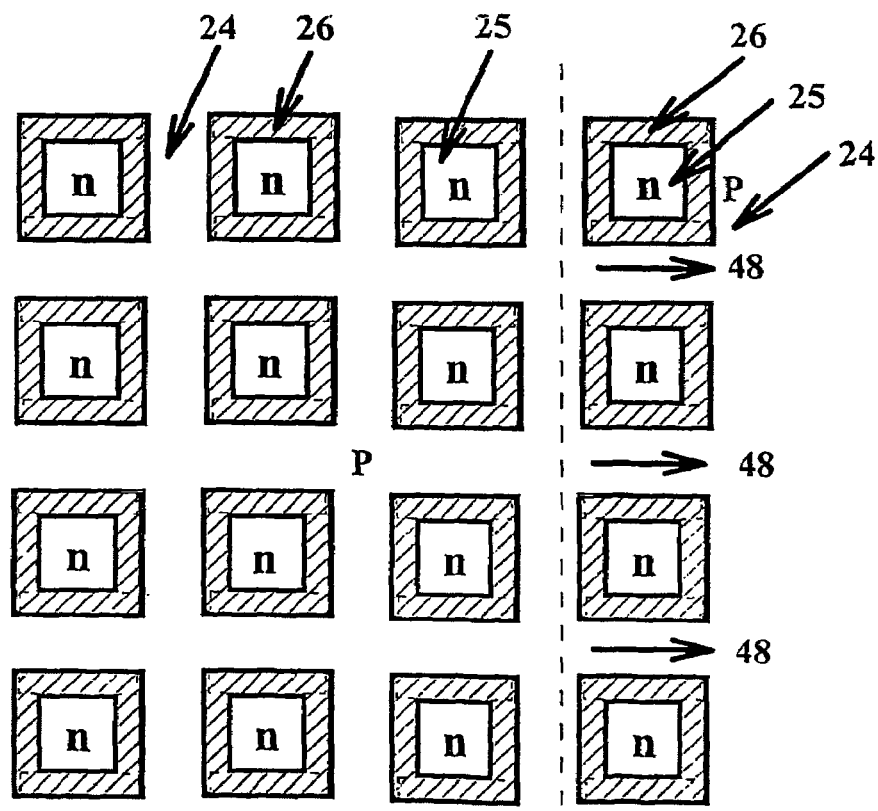
Figure 3C:
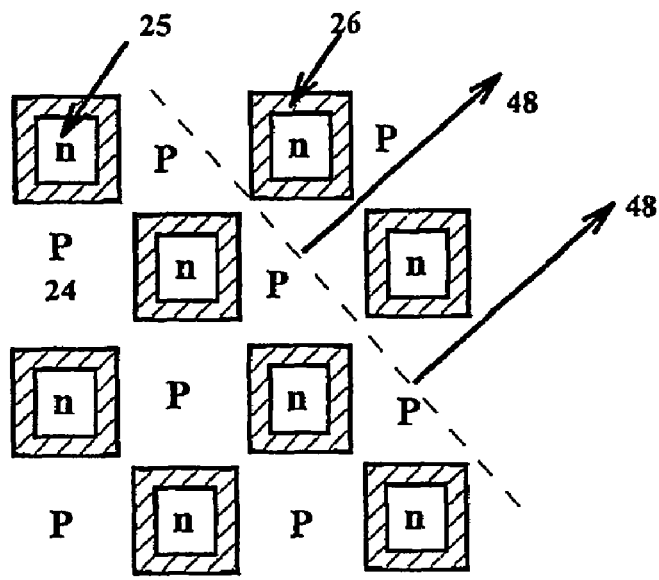
Figure 3D:
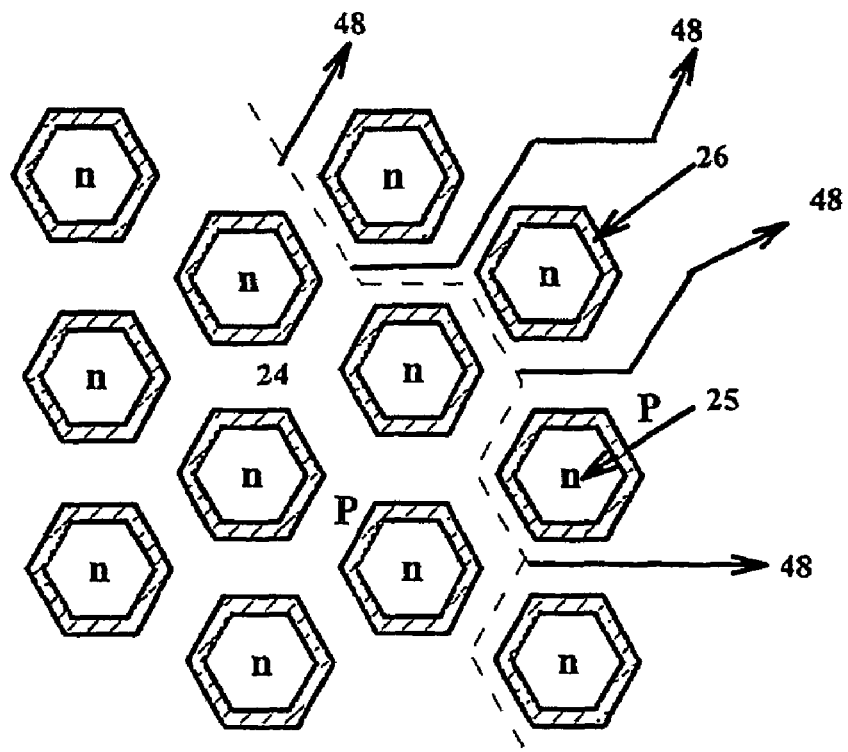

Said first mask of the first pattern means that some places are covered by the mask and the remaining places are not covered. For the four CB structures respectively with interdigitated pattern, square pattern, mosaic lattice pattern and close-packed hexagonal pattern, as shown in FIG. 3(a) to FIG. 3(b), the regions that the first mask covers are respectively like the n type regions in the four figures of FIG. 3(a) to FIG. 3(d). In other words, if the CB structure as one of the above FIGS. is to be made, the first pattern is just like the n type region as that one of the above figures.

Figure 4A:
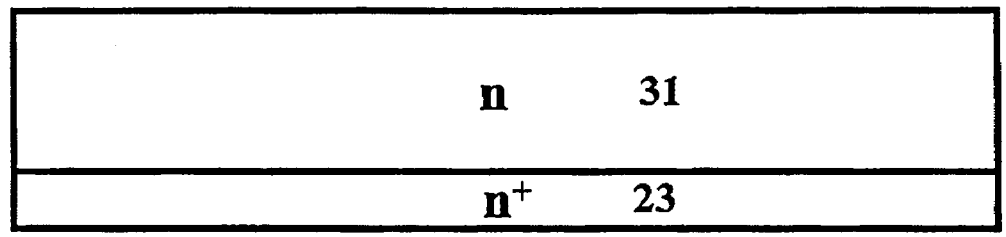
FIG. 4(a) to FIG. 4(h) show the manufacturing process of the present invention.

The method of manufacturing CB layer of the present invention will be described in detail combining with FIG. 4(a) to FIG. 4(h) as follows:

Firstly use a piece of material as FIG. 4(a), which is formed by growing a n type epitaxial layer 31 on an n+ substrate 23. Such epitaxial layer can made by firstly using such gas as HCl to wash the surface of the substrate under the vacuum at an elevated temperature on the substrate, then exposing under the silane (it can be taken by hydrogen) at an elevated temperature, and depositing silicon on the n+ substrate 23.

Figure 4B:
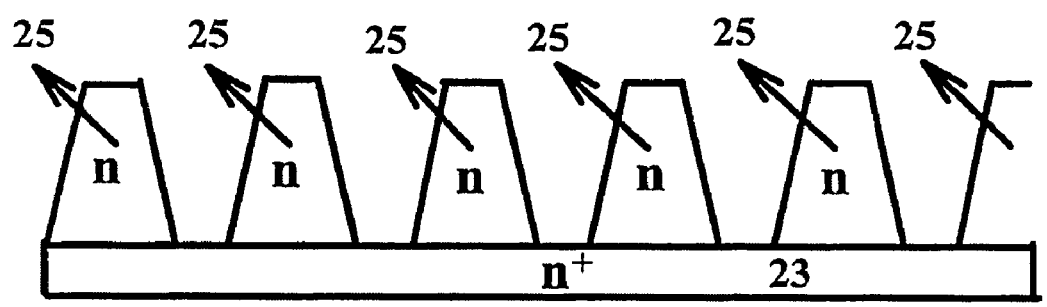

Secondly the n type epitaxial layer 31 is photo-etched with a mask so as to make the p regions 24 shown in FIG. 3(a) to FIG. 3(d) have no mask covered. Then the uncovered portions of the n type epitaxial layer 31 is etched by the anisotropy erosion method, and thereby grooves are formed on the n type epitaxial layer 31 as shown in FIG. 4(b). The grooves in FIG. 4(b) have inclined sidewalls. Since the sidewalls are preferably be more perpendicular, it is better to use the anisotropy erosion method with high selectivity. The depth of the grooves can reach the n+ substrate 23 or a position slightly higher than the n+ substrate 23.

Figure 4C:
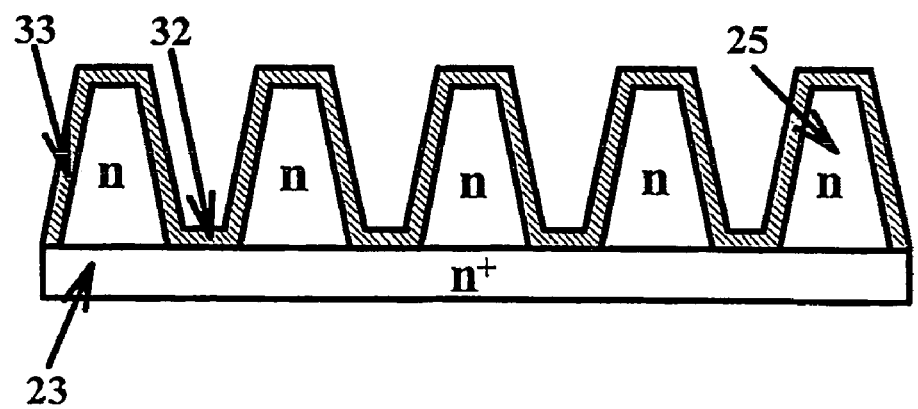

After the grooves are formed, a thin dielectric layer such as heat-growing $SiO_2$ is formed on the silicon slice, as shown in FIG. 4(c). In FIG. 4(c), the dielectric layer on the sidewalls of the n region 25 and on the region of the semiconductor surface without grooves is denoted by 33, while the dielectric layer on the bottom of the grooves is denoted by 32.

Figure 4D:
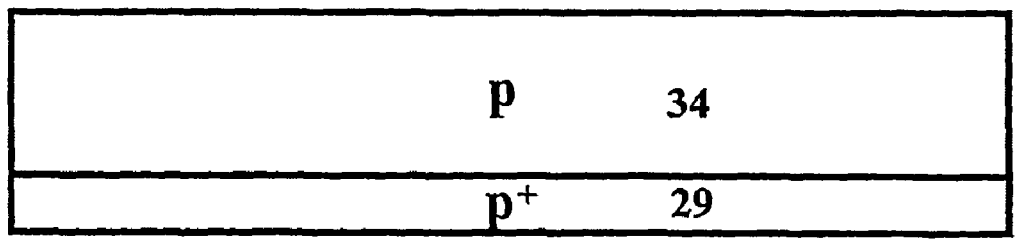
Figure 4E:
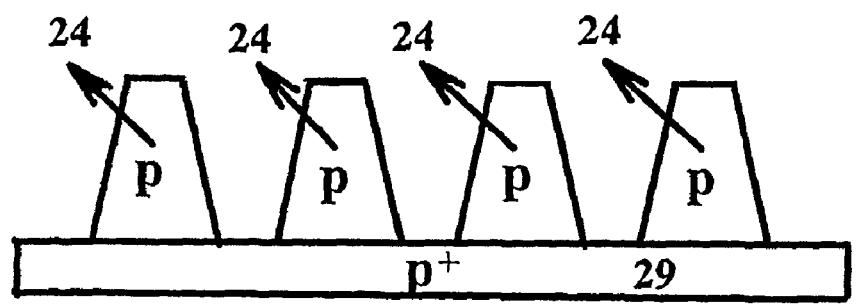
Figure 4F:
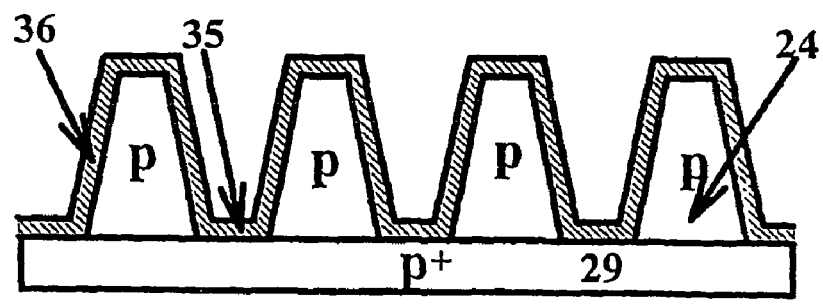

Another p type wafer is made by growing a p type epitaxial layer 34 on a p+ substrate 29, as shown in FIG. 4(d). The p type epitaxial layer 34 is photo-etched with a mask so as to make the n region 25 shown in FIG. 3(a) to FIG. 3(d) have no masks. Then the uncovered portions of the p type epitaxial layer 34 are etched by the anisotropy erosion method so as to form grooves on the p type epitaxial layer 34 as shown in FIG. 4(e). Herein, just like shown in FIG. 4(c), an oxide layer can also be created by heat as shown in FIG. 4(f). In the FIG. 4(f) the dielectric layers on the sidewalls of the p region 24 and on the region of the semiconductor surface without grooves is denoted by 36, while the dielectric layer on the bottom of the grooves is denoted by 35.

In all the processes above, the mask used for the p type wafer is designed so that the tops in FIG. 4(f) should match the bottom of the grooves in FIG. 4(c), while the tops of FIG. 4(c) should match the bottom of the groove in FIG. 4(f), and the heights of both grooves should be identical.

Figure 4G:
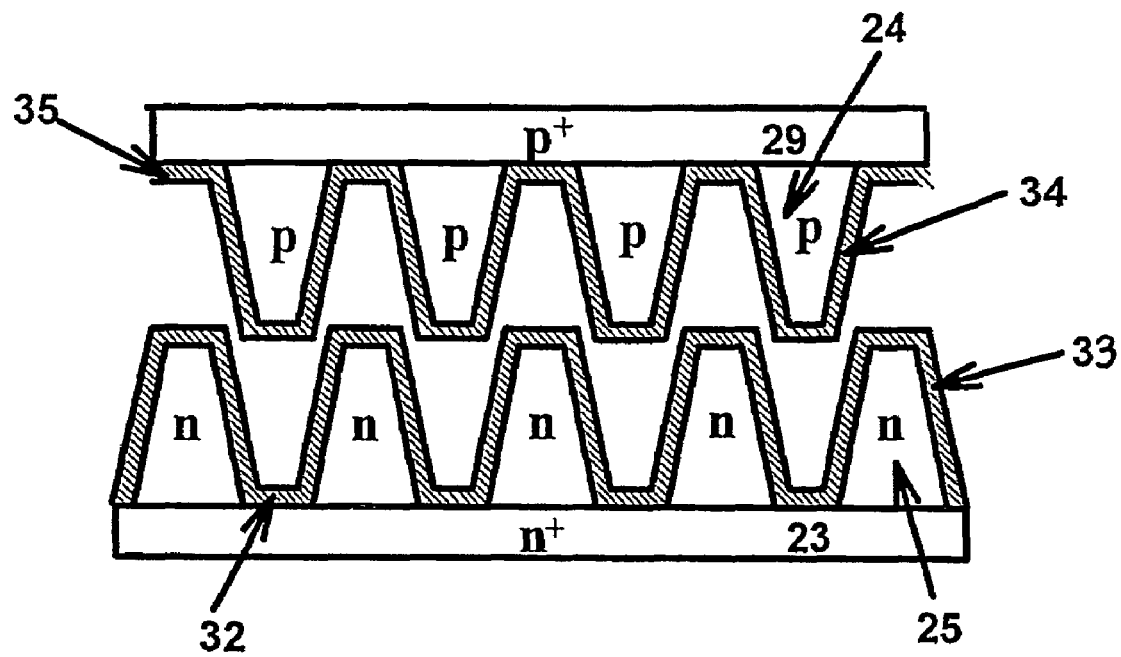

When the two wafers are well-prepared, the patterns of them are aligned as shown in FIG. 4(g). Then the tops of FIG. 4(f) are connected with the bottom of the grooves in FIG. 4(c) by heating them up to about 1100° C. to make the two wafers bond directly or bond by oxide layer.

Figure 4H:
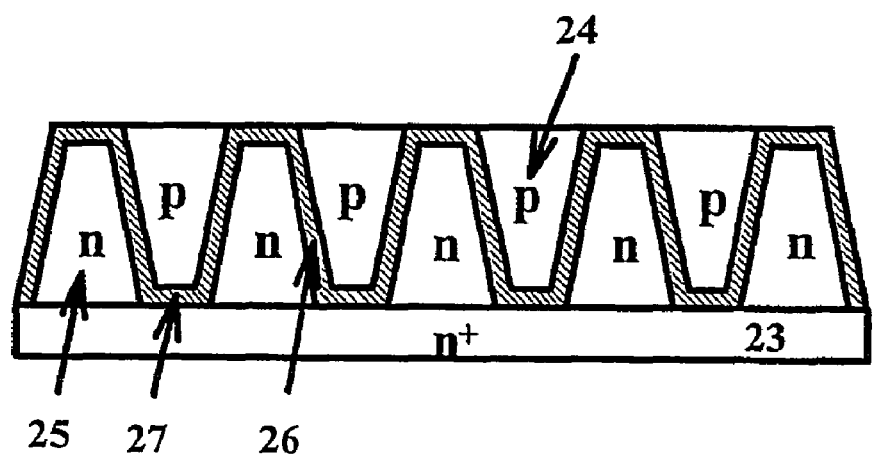

Finally, the portions of the p+ substrate 29 without etched grooves are processed by grinding, polishing or chemical mechanical polishing so as to expose such surfaces as shown in FIG. 3(a) to FIG. 3(d). As shown in FIG. 4(h), the CB layers are alternately arranged between the p region and the n region within the groove depth.

The method of making grooves is a well-known method in the semiconductor industry. In consideration of the fact that the lateral etching is frequently accompanied during the process of chemical etching or reaction ion etching, the mask pattern of the second semiconductor wafer may be a little larger than that on the bottom of the grooves of the first wafer so that the two wafers can be tightly bonded everywhere.

Figure 5:
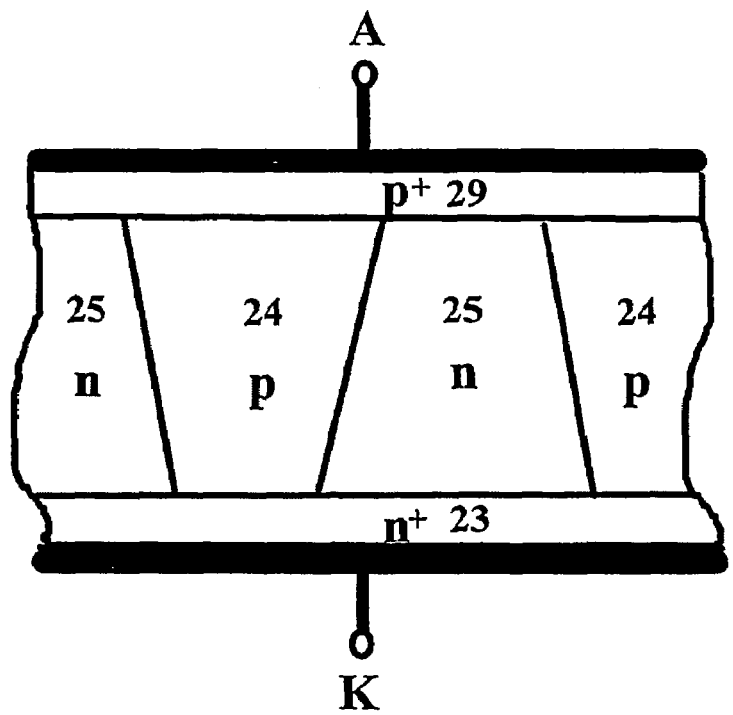
FIG. 5 illustrates a schematic view of a CB diode by the method of the present invention.

In the above stated method for manufacturing CB layer, if both wafers have no dielectric layer, and the second p type wafer has a p type epitaxial layer 24 on the $p^+$ substrate 29, and the depth of the grooves on the second p type wafer approaches the thickness of the epitaxial layer, then after manufacturing anode contact A and cathode contact B, a CB diode is finally obtained, as shown in FIG. 5. For this case, the last step of grinding and polishing the wafer doesn't have to expose the pattern in FIG. 3, but to leave a portion of $p^+$ layer 29.

Figure 6:
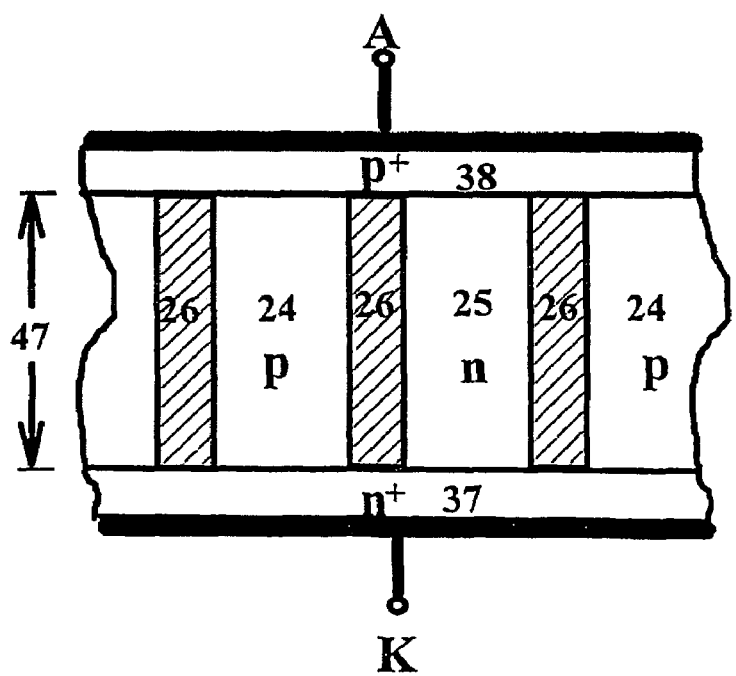
FIG. 6 illustrates a schematic view of a CB diode of high reverse voltage by the method of the present invention.

FIG. 6 provides another embodiment of manufacturing high reverse voltage CB diode in accordance with the prevent invention. Here, both the first and second semiconductor wafers have no epitaxial layers, and both semiconductor wafers are non-heavily doped single crystals. The depths of the grooves of both semiconductor wafers should be a little larger than the required thickness of voltage sustaining layer. After the bonding of both wafers, the parts have no grooves are removed by grinding and polishing process to form the portion 47 in the figure. Then the $p^+$ region and the $n^+$ region are deposited on both sides. Such $p^+$ and $n^+$ regions can be formed by depositing the $p^+$ polycrystalline semiconductor 38 on the top, while depositing the $n^+$ multi-crystalline semiconductor 37 on the bottom and a laser annealing for re-crystallizing the two polycrystalline semiconductors. The $p^+$ and $n^+$ regions can even be replaced by appropriate metal to obtain Schottky junctions.

In the following embodiments of manufacturing devices with CB voltage sustaining layers, electronic conduction is referred in the on-state. In the case of bipolar transistor, the emitter E is connected with the $n^+$ emitter region, the base B is connected with the p base region and the collector C is connected with the bottom $n^+$ region. In the case of MOST, the source S is connected with the $n^+$ source region and the $p^+$ source substrate region, and the drain D is connected with the $n^+$ substrate. Only a section of one cell of the devices is shown in the schematic view of each device structure.

Figure 7:
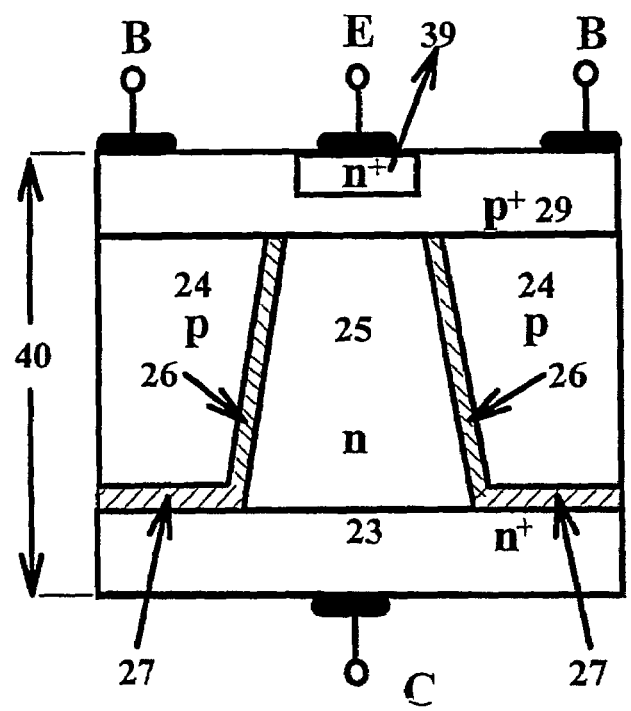
FIG. 7 illustrates a schematic view of a CB bipolar transistor by the method of the present invention.

FIG. 7 provides an embodiment of manufacturing bipolar transistors with CB voltage sustaining layers in accordance with the present invention. Here, the first semiconductor wafer has an n type epitaxial layer 25 on the $n^+$ substrate 23 and the depth of the grooves approaches the thickness of the epitaxial layer. Meanwhile, the second semiconductor wafer has a p type epitaxial layer 24 with a thickness approaching the depth of the grooves of the first semiconductor wafer on the $p^+$ substrate 29. The depth of the grooves of the second semiconductor wafer is the same as that of the first semiconductor wafer. However, the second semiconductor wafer has no dielectric layer. The first semiconductor wafer's surface without grooves of the first wafer also has no dielectric layer. After the bonding of the two wafers, the $p^+$ substrate 29 contacts the n region 25 directly. It becomes the portion 40 in the figure after grinding and polishing. Then an $n^+$ emitter region 39 and the metal contacts and the connecting lines of the emitter E, the base B and the collector C.

It is easy to make the top of the first semiconductor wafer without dielectric layers. For example, it can be done by masking the top surface during deposition of the dielectric, and then removing the mask after deposition of the dielectric. Another way is to remove the dielectric on the top by grinding and polishing the top surface after the whole semiconductor wafer has been covered by the dielectric.

Figure 8:
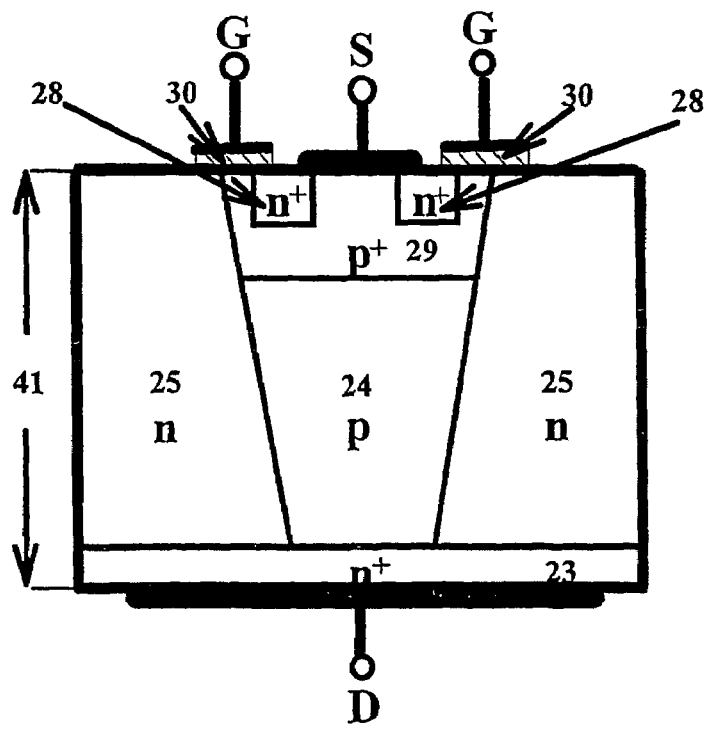
FIG. 8 illustrates a schematic view of a VDMOST with a CB voltage sustaining layer which has no dielectric layer between the p region and the n region by the method of the present invention.

FIG. 8 provides an embodiment of manufacturing VDMOST with CB voltage sustaining layers according to the present invention. Herein, the second semiconductor wafer has a p type epitaxial layer 24 with a thickness less than the depth of the grooves of the first semiconductor wafer on the $p^+$ substrate 29, while the depth of the grooves of the second semiconductor wafer is the same as that of the first semiconductor wafer. Both the wafers have no dielectric layers. The $p^+$ substrate of the bonded semiconductor wafers is removed by grinding and polishing process until the n type epitaxial layer of the first semiconductor wafer is exposed so as to form the portion 41 in the FIG. 8. Then the active regions of the device including the $n^+$ source region 28, the gate oxide layer 30, the gate electrode G, the source S and the drain D are made.

Figure 9A:
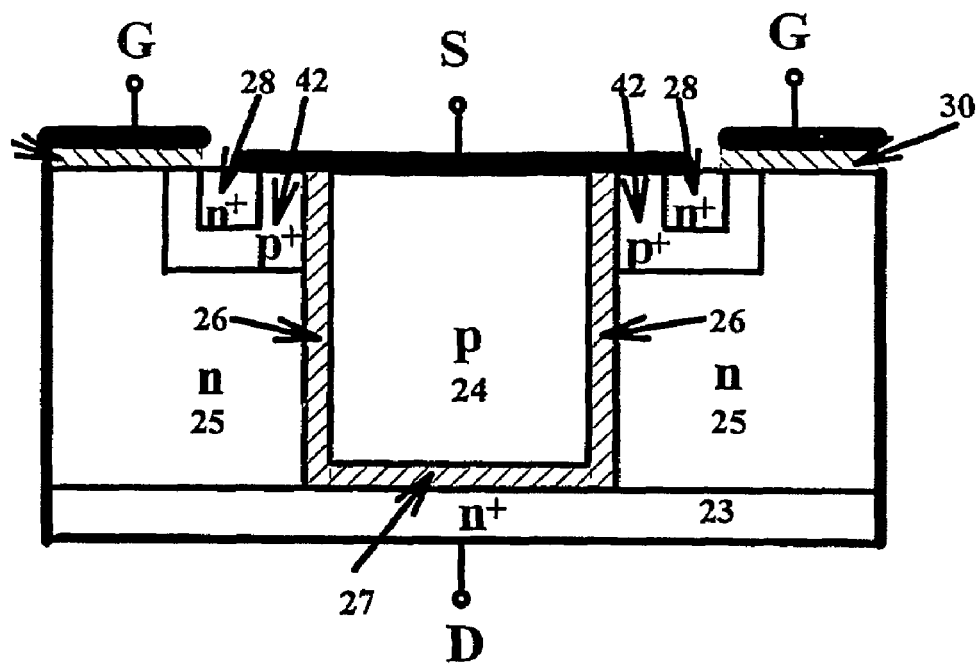
FIG. 9(a) to FIG. 9(b) illustrate schematic views of a VDMOST with a CB voltage sustaining layer which has a dielectric layer between the p region and the n region and also has a dielectric layer between the p region and the $n^+$ drain region by the method of the present invention.
Figure 9B:
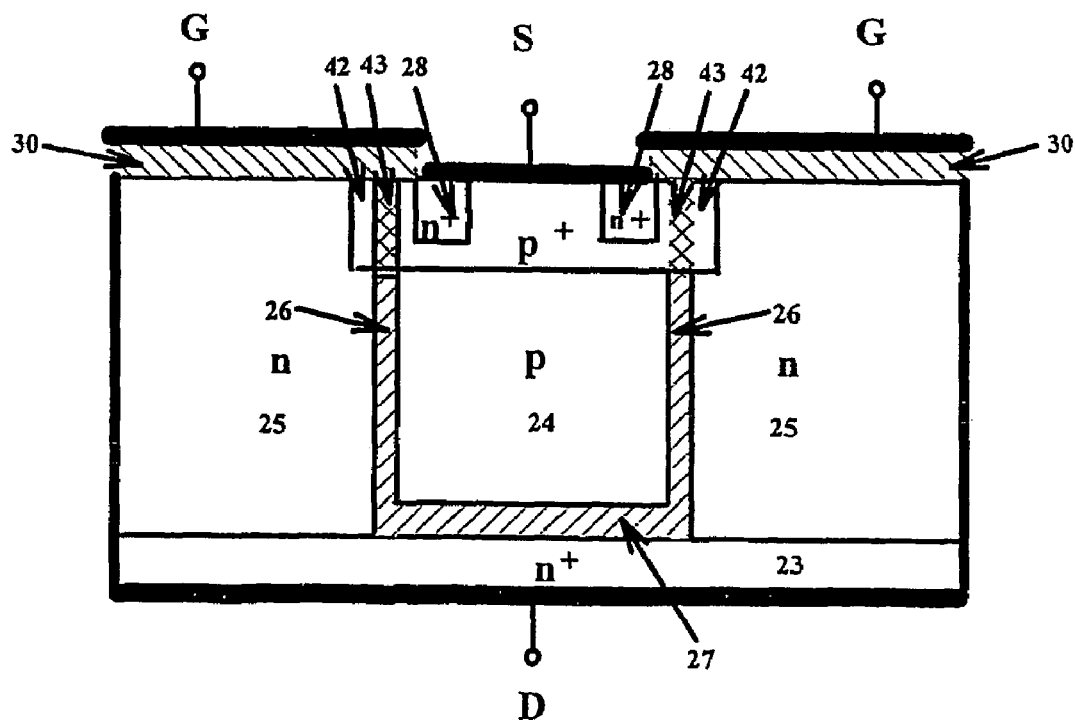

FIG. 9($a$) and FIG. 9($b$) provide two embodiments of manufacturing VDMOST with CB voltage sustaining layer in accordance with the present invention. The dielectric is provided between the p region 24 and the n region 25 as well as between the p region 24 and the $n^+$ drain region 23. There are at least two methods to accomplish the feature layers of the device. One is as shown in FIG. 9($a$), wherein the electrode contact of the source is not only connected with $n^+$ source region 28 and $p^+$ source substrate region 42, but also must be connected with the top of the p region 24. Another is as shown in FIG. 9($b$), wherein the neck of the top of each n region clamped by its neighboring two source substrate $p^+$ regions 42 is wider than that in FIG. 9($a$) so as to further reduce the on-resistance. However, in this case, it is necessary to remove the top dielectric layer between the n region 25 and p region 24, e.g. by the method of chemical etching. Thereafter fill the removed portion with the poly-semiconductor followed by a laser annealing to re-crystallize the portion to make it become single crystals. The re-crystallized portion 43 in FIG. 9($b$) is shown by the cross shaded area.

The case of a transistor which has a dielectric layer to isolate the p region from the neighboring n region and a dielectric layer to isolate the p region from the $n^+$ contact layer when the two wafers are bonded correspondingly will be discussed in detail in the following.

Having the dielectric layers gets the following advantages over having no dielectric layers: 1) in the case of FIG. 2($a$), when the lateral field at C point is very high, the breakdown voltage can not be increased. The breakdown is along the electric field line denoted by the dotted line 44 in the figure. In the case of having the dielectric layers in FIG. 2($b$), since the integral of impact ionization rate for determining the breakdown voltage is only along the electric field line 45 on the upper portion (in the p type region 24) or along the electric field line 46 on the lower portion (in the n type region 25), the breakdown voltage can be increased. Or under the same breakdown voltage, n region 25 and p region 24 can be doped heavier so as to reduce the on-resistance. 2) in the case of manufacturing the CB layer with the dielectric layers, the dielectric layer can be selected to obstruct the diffusion of dopants between the n region and the p region of the CB layer in the elevated temperature process in order to make the control in the manufacture become easier. 3) If the semiconductor material is, e.g., Si, the bond of silicon slice having the dielectric layer (e.g. the $SiO_2$ layer) is Si—$SiO_2$—Si bonding, which can be made better than Si—Si direct bonding.

However, the CBMOSFET with the dielectric layers is a normally-on device if no measure has been taken. The reasons are as follows:

The electron-hole pairs would be produced in the recombination centers of the thick depleted layer under the high reverse bias pressure. According to Shockley-Read-Hall theory, the current density generated from the electron-hole pairs can be expressed by $qn_iW/(\tau_{no}+\tau_{po})$, wherein $\tau_{no}$ and $\tau_{po}$ refer to the small-signal lifetime for the electrons and holes respectively, $n_i$ refers to the intrinsic carrier concentration, W refers to the thickness of the depleted layer, and q refers to the electron charge. In the turn-off process, the holes produced in the p region 24 can be swept to the $p^+$ source substrate region 29 by the electric field, whereas the electron s produced in the p region 24 could be swept to the $n^+$ drain region 23 when the p region 24 is directly connected with the $n^+$ drain region 23, as shown in FIG. 2(a). However, if there exist the dielectric layers between the p region 24 and the $n^+$ drain region 23 as well as between the p region 24 and the n region 25, as shown in FIG. 2(b), then the electrons will be accumulated on the bottom of the p region 24 near the n region 25. Such accumulated electron will form an inversion layer. The negative charge of such inversion layer changes the distribution of the electric field and thereby reduces the breakdown voltage.

Actually, the effect of said the leakage electron current is easy to eliminate, by connecting all the p regions 24 and then directly connect the p region 24 and the $n^+$ drain region 23 in the termination region out of the active regions. The arrows in FIG. 3(a) to FIG. 3(d) show the direction from the active region to the termination region.

Certainly, if each cell on the bottom of the p region and in the $n^+$ drain region of the CB layer is connected directly, the effect of said leakage electron current will be directly eliminated. Thus, it is required not only that the surface of the region without grooves of the second semiconductor wafer is not covered with the dielectric layers, but also that the bottoms of the grooves of the first semiconductor wafer have no dielectric layers. The latter requirement can be achieved by using the RIE(reaction ion etching) or other methods combing with a mask.

Figure 10:
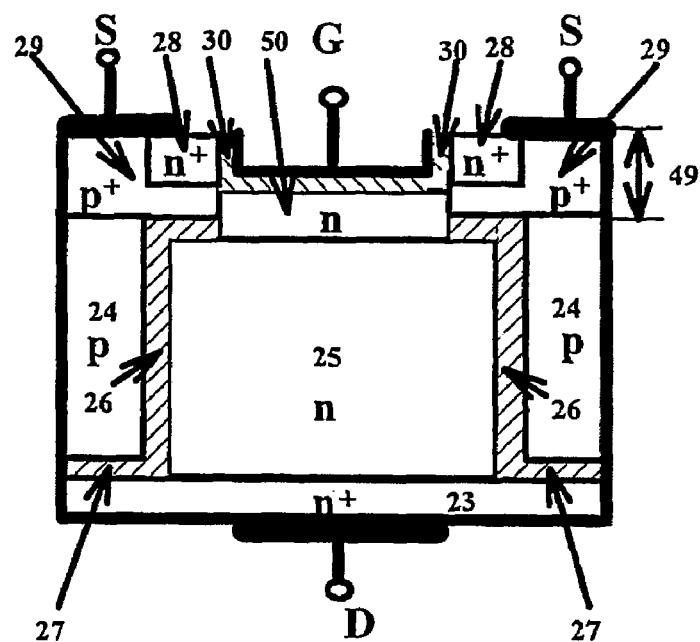
FIG. 10 illustrates a schematic view of a RMOST which has a dielectric layer between the p region and the n region and also has a dielectric layer between the p region and the $n^+$ drain region by the method of the present invention.

FIG. 10 provides an embodiment of manufacturing the RMOST with the dielectric layers in accordance with the present invention. After bonding of the grooved first wafer having the n type epitaxial layers with the grooved second semiconductor wafer having the p type epitaxial layers, the second $p^+$ substrate 29 is not completely removed by grinding, but leaving a thickness of $p^+$ region 49 in the figure. Then a trench is made above the n region 25. In etching the trench, the dielectric layer is also etched away. Then the n type semiconductor is deposited on the bottom of the trench, as the portion 50 shown in the figure, so that the top of the n type region 25 is directly connected with the $p^+$ type region 29 via n region 50. Next, the conventional method of making RMOST is applied.

Figure 11:
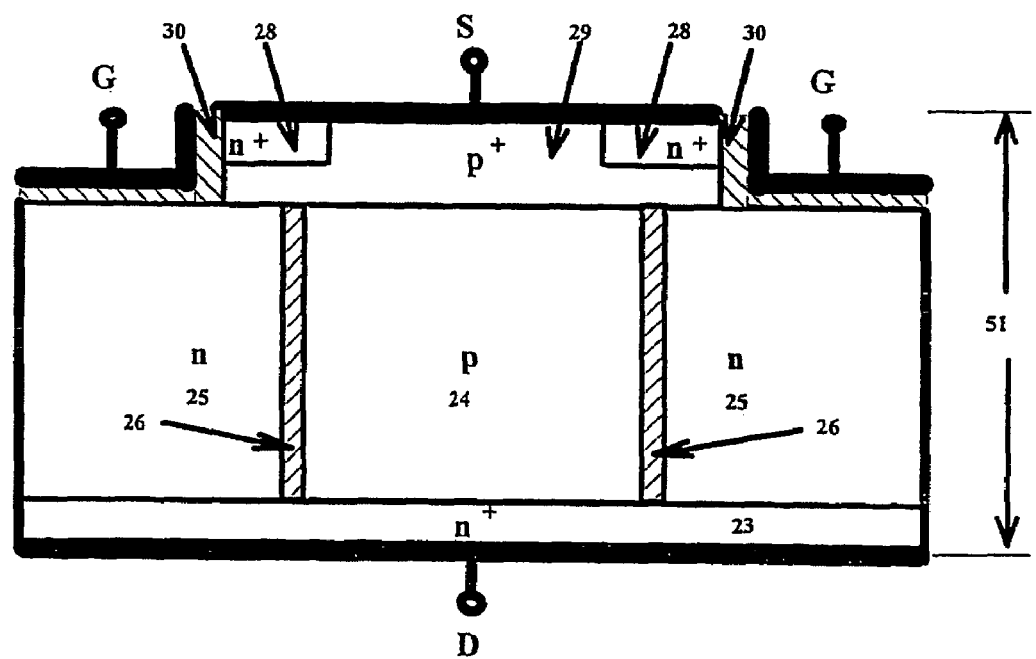
FIG. 11 illustrates a schematic view of a RMOST which has a dielectric layer between the p region and the n region but has no dielectric layer between the p region and the $n^+$ drain region by the method of the present invention.

FIG. 11 provides another embodiment of manufacturing the RMOST in accordance with the present invention. Herein, it is required that the first semiconductor wafer has the $n^+$ substrate and the n type epitaxial layer, while the second semiconductor wafer has the $p^+$ substrate and the p type epitaxial layer. It is also required that no dielectric layer is on the bottom of the grooves and the surface of the first semiconductor wafer outside of the grooves, and no dielectric layer is on the bottom of the grooves and the surface of the second semiconductor wafer outside of the grooves. The two wafers are bonded to form a region of thickness 51 in the figure. Then an $n^+$ source region 28 is formed in the $p^+$ region 29 and then a trench is formed by etching. Next is to make the gate oxide layer 30 and the electrodes.

Figure 12:
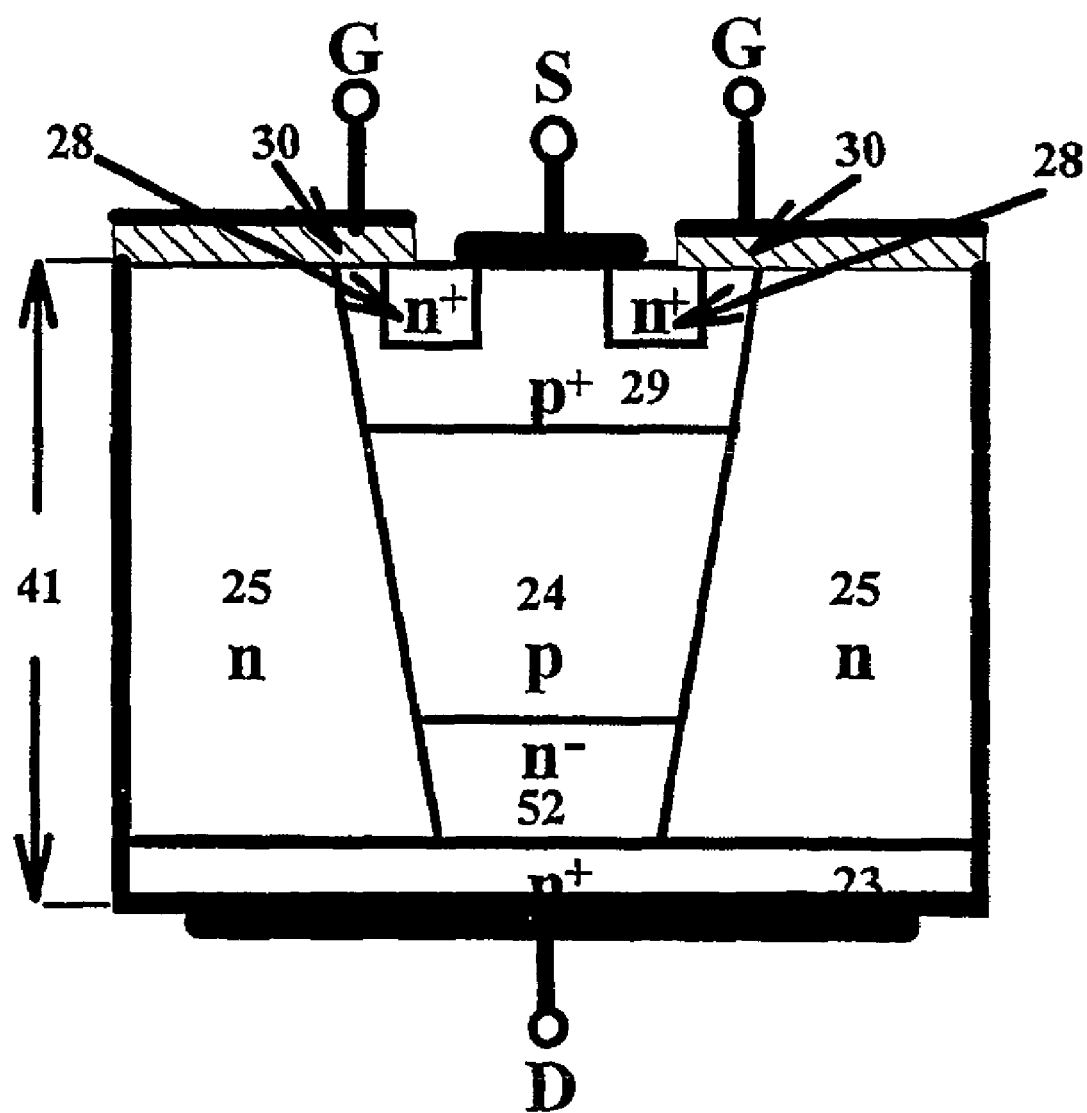
FIG. 12 illustrates a schematic view of a VDMOST with a CB voltage sustaining layer which is similar to that in FIG. 8 but has the n region under the p region by the method of the present invention.

In the CB structure, it is very often that a maximum electric field is created in the central part of the interface of the p region and the $n^+$ substrate. In order to further increase the breakdown voltage, one can make the acceptor concentration underneath the p region 24 be lower than that above the p region 24. One can even let the lowest portion of the p region 24 gradually transform from the p type to the n type. One of the structures is shown in FIG. 12. The difference between FIG. 12 and FIG. 8 lies only in that the lowest portion of the p region becomes a lightly doped n type region 52. In accordance with the spirit of the present invention, it also can be made in such way that an n type epitaxial layer on the second semiconductor wafer is grown after the p type epitaxial layer has been grown on the $p^+$substrate. Alternatively, the diffusion of the n type dopants is performed so as to make the surface of the second semiconductor wafer become n type. Other methods are the same as that of manufacturing the devices in FIG. 8.

As far as the silicon devices are concerned, the above mentioned dielectric layer can be a $SiO_2$ layer, or other dielectric layer. Even if an oxide layer has been grown on the surface of Si, one can still cover it with other dielectric layers. The latter dielectric layer prefers using a material that has a high permittivity and can make the silicon slice bond well. The preference of high permittivity is due to that then the effect of the flux generated by the positive charges of ionized donor of n-region and terminated by the negative charges of ionized acceptors of p-region will not be affected. In other words, the charge compensation effect will not be influenced.

Many embodiments of the method for manufacturing the devices according to the prevent invention are described. It is obvious for those skilled in the art that various changes and devices can be made with the spirit of the present invention. Therefore, all the obvious changes within the scope of the spirit of the present invention should be included in the protection scope of the present invention as defined in the claims.

INDUSTRIAL APPLICATION

The present invention provides a simple method of manufacturing CB layer, which doesn't require many times of epitaxy process, ion-implantation and photo-etching, and so the cost can by reduced.

What is claimed is:

1. A method for manufacturing a semiconductor device with composite buffer layer, which comprises the steps of:
   covering a first semiconductor wafer of a first conductivity type with a first mask of a first pattern, wherein the first mask of the first pattern makes some portions of the surface of the semiconductor wafer be covered by the first mask while the other portions are not covered;
   etching the portions of the semiconductor wafer uncovered by the mask, so as to form first mosaic grooves of first depth, which have bottoms and sidewalls;
   forming a thin dielectric layer on the sidewall of the groove, and/or a thin dielectric layer on the bottom of the groove, and/or a thin dielectric layer on the surface of the first semiconductor wafer outside the groove, on the first semiconductor wafer having the first mosaic grooves;
   covering a second semiconductor wafer of a second conductivity type with a second mask of a second pattern, wherein the second mask of the second pattern makes the portions of the second semiconductor wafer covered by the second mask be identical with the pattern formed by the bottoms of the grooves of the first semiconductor wafer;

etching the portions of the second semiconductor wafer uncovered by the second mask, so as to form second mosaic grooves which have bottoms, sidewalls, and depths approaching the first depth;

forming a thin dielectric layer on the sidewall of the groove, and/or a thin dielectric layer on the bottom of the groove, and/or a thin dielectric layer on the surface of the first semiconductor wafer outside the groove, on the second semiconductor wafer having the second mosaic grooves;

bonding the surface outside the grooves of the second semiconductor wafer with the bottoms of the grooves of the first semiconductor wafer, bonding the bottoms of the grooves of the second semiconductor wafer with the surface outside the grooves of the first semiconductor wafer, and bonding the sidewalls of the grooves of the first semiconductor wafer with the sidewalls of the grooves of the second semiconductor, so that the two wafers are bonded as one semiconductor wafer; and forming the composite buffer layer within the first depth in the bonded semiconductor wafer.

2. A method for manufacturing a semiconductor device with composite buffer layer according to claim 1, wherein the dielectric layer is made of silicon dioxide.

3. A method for manufacturing a semiconductor device with composite buffer layer according to claim 1, wherein the thin dielectric layer is formed on the sidewalls, the bottoms and the surface outside the grooves on the first semiconductor wafer with the first mosaic grooves and the second semiconductor wafer with the second mosaic grooves.

4. A method for manufacturing a semiconductor device with composite buffer layer according to claim 1, wherein the thin dielectric layer is formed on the sidewalls of the grooves on the first semiconductor wafer with the first mosaic grooves.

5. A method for manufacturing a semiconductor device with composite buffer layer of claim 1, wherein the thin dielectric is formed on the sidewalls and the bottoms of the grooves on the first semiconductor wafer with the first mosaic grooves.

6. A method for manufacturing a semiconductor device with composite buffer layer of claim 1, wherein the thin dielectric is formed on the sidewalls of the grooves on the second semiconductor wafer with the second mosaic grooves.

7. A method for manufacturing a semiconductor device with composite buffer layer of claim 1, wherein the thin dielectric is formed on the sidewalls and the bottoms of the grooves on the second semiconductor wafer with the second mosaic grooves.

8. A method for manufacturing a semiconductor device with composite buffer layer, which comprises the steps of:

covering a first semiconductor wafer of a first conductivity type with a first mask of a first pattern, wherein the first mask of the first pattern makes some portions of the surface of the semiconductor wafer be covered by the first mask while the other portions are not covered;

etching the portions of the semiconductor wafer uncovered by the mask, so as to form first mosaic grooves of first depth, which have bottoms and sidewalls;

covering a second semiconductor wafer of a second conductivity type with a second mask of a second pattern, wherein the second mask of the second pattern makes the portions of the second semiconductor wafer covered by the second mask be identical with the pattern formed by the bottoms of the grooves of the first semiconductor wafer;

etching the portions of the second semiconductor wafer uncovered by the second mask, so as to form second mosaic grooves which have bottoms, sidewalls, and depths approaching the first depth;

bonding the surface outside the grooves of the second semiconductor wafer with the bottoms of the grooves of the first semiconductor wafer, bonding the bottoms of the grooves of the second semiconductor wafer with the surface outside the grooves of the first semiconductor wafer, and bonding the sidewalls of the grooves of the first semiconductor wafer with the sidewalls of the grooves of the second semiconductor, so that the two wafers are bonded as one semiconductor wafer; and forming the composite buffer layer within the first depth in the bonded semiconductor wafer.

9. A method for manufacturing a semiconductor device with composite buffer layer according to claim 1 or 8, wherein the step of forming the first mosaic groove adopts an anisotropic etching method.

10. A method for manufacturing a semiconductor device with composite buffer layer according to claim 1 or 8, wherein the step of forming the second mosaic groove adopts an anisotropic etching method.

11. A method for manufacturing a semiconductor device with composite buffer layer according to claim 1 or 8, wherein the materials of both the first semiconductor wafer and second semiconductor wafer are silicon.

12. A method for manufacturing a semiconductor device with composite buffer layer according to claim 1 or 8, wherein the first semiconductor wafer of the first conductivity type includes a first epitaxial layer of the first conductivity type and a heavily doped substrate of the first conductivity type; the first mosaic groove is formed in the first epitaxial layer, and the thickness of the first epitaxial layer approaches the first depth of the groove.

13. A method for manufacturing a semiconductor device with composite buffer layer according to claim 1 or 8, wherein the second semiconductor wafer of the second conductivity type includes a second epitaxial layer of the second conductivity type and a heavily doped substrate of the second conductivity type; the second mosaic groove is formed in the second epitaxial layer, and the thickness of the second epitaxial layer approaches the first depth of the groove.

14. A semiconductor device with composite buffer layer, wherein a first semiconductor wafer of a first conductivity type is covered with a first mask of a first pattern which makes some portions of the surface of the semiconductor wafer be covered by the first mask while the other portions are not covered;

first mosaic grooves of first depth which have bottoms and sidewalls are at the etched portions of the semiconductor wafer uncovered by the mask;

a thin dielectric layer is on the sidewall of the groove, and/or a thin dielectric layer is on the bottom of the groove, and/or a thin dielectric layer is on the surface of the first semiconductor wafer outside the groove, on the first semiconductor wafer having the first mosaic grooves;

a second semiconductor wafer of a second conductivity type is covered with a second mask of a second pattern, wherein the second mask of the second pattern makes the portions of the second semiconductor wafer covered by the second mask be identical with the pattern formed by the bottoms of the grooves of the first semiconductor wafer;

second mosaic grooves which have bottoms, sidewalls, and depths approaching the first depth are at the etched portions of the second semiconductor wafer uncovered by the second mask;

a thin dielectric layer is on the sidewall of the groove, and/or a thin dielectric layer is on the bottom of the groove, and/or a thin dielectric layer is on the surface of the first semiconductor wafer outside the groove, on the second semiconductor wafer having the second mosaic grooves;

the surface outside the grooves of the second semiconductor wafer is bonded with the bottoms of the grooves of the first semiconductor wafer, the bottoms of the grooves of the second semiconductor wafer are bonded with the surface outside the grooves of the first semiconductor wafer, and the sidewalls of the grooves of the first semiconductor wafer are bonded with the sidewalls of the grooves of the second semiconductor, so that the two wafers are bonded as one semiconductor wafer; and the composite buffer layer is within the first depth in the bonded semiconductor wafer.

15. A semiconductor device with composite buffer layer, wherein a first semiconductor wafer of a first conductivity type is covered with a first mask of a first pattern which makes some portions of the surface of the semiconductor wafer be covered by the first mask while the other portions are not covered;

first mosaic grooves which have bottoms and sidewalls with first depth are at the etched portions of the semiconductor wafer uncovered by the mask;

a second semiconductor wafer of a second conductivity type is covered with a second mask of a second pattern, wherein the second mask of the second pattern makes the portions of the second semiconductor wafer covered by the second mask be identical with the pattern formed by the bottoms of the grooves of the first semiconductor wafer;

second mosaic grooves which have bottoms, sidewalls, and depths approaching the first depth are at the etched portions of the second semiconductor wafer uncovered by the second mask;

the surface outside the grooves of the second semiconductor wafer is bonded with the bottoms of the grooves of the first semiconductor wafer, the bottoms of the grooves of the second semiconductor wafer are bonded with the surface outside the grooves of the first semiconductor wafer, and the sidewalls of the grooves of the first semiconductor wafer are bonded with the sidewalls of the grooves of the second semiconductor, so that the two wafers are bonded as one semiconductor wafer; and the composite buffer layer is within the first depth in the bonded semiconductor wafer.

* * * * *